United States Patent
Sarig

(10) Patent No.: US 11,411,495 B2
(45) Date of Patent: Aug. 9, 2022

(54) APPARATUS, SYSTEM AND METHOD OF A METAL-OXIDE-SEMICONDUCTOR (MOS) TRANSISTOR INCLUDING A SPLIT-GATE STRUCTURE

(71) Applicant: TOWER SEMICONDUCTOR LTD., Migdal Haemek (IL)

(72) Inventor: Erez Sarig, Kadima (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 227 days.

(21) Appl. No.: 16/909,297

(22) Filed: Jun. 23, 2020

(65) Prior Publication Data
US 2021/0399634 A1    Dec. 23, 2021

(51) Int. Cl.
*H01L 29/40* (2006.01)
*H02M 3/156* (2006.01)
(Continued)

(52) U.S. Cl.
CPC .......... *H02M 3/156* (2013.01); *H01L 29/402* (2013.01); *H03K 17/04* (2013.01); *H03K 17/687* (2013.01)

(58) Field of Classification Search
CPC ... H02M 3/156; H02M 3/158; H01L 29/0653; H01L 29/0692; H01L 29/1095; H01L 29/404; H01L 29/7816; H01L 29/7831; H03K 17/04; H03K 17/0406; H03K 17/687

See application file for complete search history.

(56) References Cited

U.S. PATENT DOCUMENTS 8,969,958 B1 * 3/2015 Khemka ............. H01L 29/7835
257/341
8,987,818 B1 * 3/2015 McGregor .......... H01L 29/0653
257/341
(Continued)

FOREIGN PATENT DOCUMENTS

EP    1170803    9/2002

OTHER PUBLICATIONS

Office Action for U.S. Appl. No. 15/356,601, dated May 25, 2018, 16 Pages.
(Continued)

*Primary Examiner* — Matthew V Nguyen
(74) *Attorney, Agent, or Firm* — Shichrur & Co.

(57) ABSTRACT

Some demonstrative embodiments include a Metal-Oxide-Semiconductor (MOS) transistor including a split-gate structure. For example, an Integrated Circuit (IC) may include a MOS including a body; a source; a drain; and a split-gate structure including a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and a voltage controller configured to apply a variable control voltage to the voltage-controlled FP, the variable control voltage based on at least one control parameter, the at least one control parameter including at least one of a load current driven by the MOS transistor or a switching frequency of the switching voltage.

23 Claims, 10 Drawing Sheets

(51) Int. Cl.
*H03K 17/04* (2006.01)
*H03K 17/687* (2006.01)

(56) References Cited

U.S. PATENT DOCUMENTS

| | | | |
|---|---|---|---|
| 10,217,826 | B2 | 2/2019 | Kantarovsky et al. |
| 10,825,717 | B1* | 11/2020 | Zhu .................. H01L 29/66659 |
| 2002/0196098 | A1 | 12/2002 | Sasabata et al. |
| 2006/0039173 | A1 | 2/2006 | Noda |
| 2009/0268538 | A1 | 10/2009 | Fukushima |
| 2010/0001704 | A1 | 1/2010 | Williams |
| 2010/0171179 | A1 | 7/2010 | Liu et al. |
| 2010/0171659 | A1 | 7/2010 | Waters et al. |
| 2014/0346597 | A1* | 11/2014 | Feilchenfeld ......... H01L 29/402 438/286 |
| 2015/0041889 | A1 | 2/2015 | Sun |
| 2015/0061008 | A1 | 3/2015 | McGregor et al. |
| 2018/0219533 | A1 | 8/2018 | Khayat et al. |
| 2020/0274002 | A1* | 8/2020 | Haynie ................ H01L 29/402 |

OTHER PUBLICATIONS

Notice of Allowance for U.S. Appl. No. 15/356,601, dated Oct. 15, 2018, 5 Pages.

* cited by examiner

APPARATUS, SYSTEM AND METHOD OF A METAL-OXIDE-SEMICONDUCTOR (MOS) TRANSISTOR INCLUDING A SPLIT-GATE STRUCTURE

TECHNICAL FIELD

Embodiments described herein generally relate to a Metal-Oxide-Semiconductor (MOS) transistor including a split-gate structure.

BACKGROUND

A switch mode converter may be configured to manage power of an electronic circuit.

The switch mode converter may include one or more Metal-Oxide-Semiconductor (MOS) transistors, which may be operable as a switch to switch the switch mode converter.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
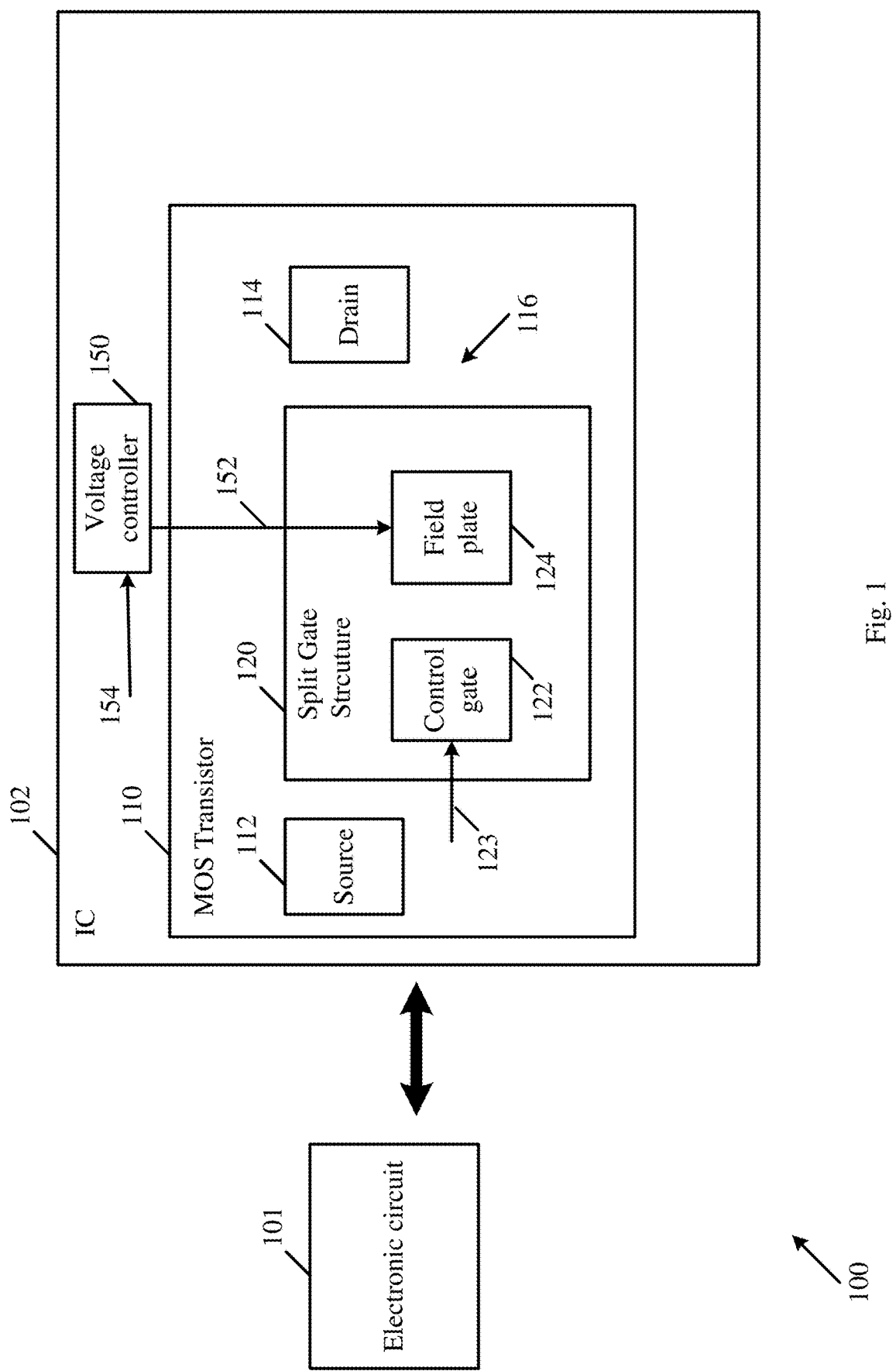
FIG. 1 is a schematic block diagram illustration of an apparatus, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Reference is made to FIG. 1, which schematically illustrates a block diagram of an apparatus 100, in accordance with some demonstrative embodiments.

In some demonstrative embodiments, apparatus 100 may include an electronic circuit 101.

In one example, electronic circuit 101 may include, may be part of, and/or may be implemented as part of, a memory, a processor, a controller, and/or any other electronic circuit.

In some demonstrative embodiments, apparatus 100 may include an Integrated Circuit (IC) 102 configured to manage power of one or more components of electronic circuit 101.

In some demonstrative embodiments, IC 102 may be configured to supply voltage to electronic circuit 101, e.g. as described below.

In some demonstrative embodiments, IC 102 may include a metal-oxide-semiconductor (MOS) IC formed on a wafer.

In some demonstrative embodiments, IC 102 may include a Power Management Integrated Circuit (PMIC) configured to manage the power of one or more components of electronic circuit 101.

In some demonstrative embodiments, IC 102 may include a switch mode converter, for example, configured to supply voltage to the electronic circuit 101.

In some demonstrative embodiments, IC 102 may include a buck converter configured to step-down voltage for electronic circuit 101.

In some demonstrative embodiments, IC 102 may include a boost converter configured to step-up voltage for electronic circuit 101.

In some demonstrative embodiments, IC 102 may include a buck/boost converter configured to step-up and/or step-down voltage for electronic circuit 101.

In some demonstrative embodiments, IC 102 may be configured to perform one or more additional or alternative functionalities and/or operations of power management, control and/or supply for one or more elements of electronic circuit 101.

In some demonstrative embodiments, IC 102 may be included, and/or may be implemented as part of electronic circuit 101.

In one example, apparatus 100 may include a System on Chip (SoC), which may be formed on the wafer. For example, the SoC may be configured to perform one or more functionalities of electronic circuit 101 and/or IC 102.

In some demonstrative embodiments, IC 102 and electronic circuit 101 may be implemented as separate elements of apparatus 100.

In one example, apparatus 100 may include an electronic circuit board including IC 102 and electronic circuit 101, which may be connected using one or more interconnectors, tracers, and/or wires.

In some demonstrative embodiments, IC 102 may include a MOS transistor 110.

In some demonstrative embodiments, the MOS transistor 110 may be operable as a switching transistor of the switch mode converter, e.g., as descried below.

In one example, the MOS transistor 110 may be configured to drive power stages of the switch mode converter.

In some demonstrative embodiments, the MOS transistor 110 may be operable as a High-Side (HS) switch of the switch mode converter, e.g., as descried below.

In some demonstrative embodiments, the MOS transistor 110 may be operable as a Low-Side (LS) switch of the switch mode converter, e.g., as descried below.

In some demonstrative embodiments, MOS transistor 110 may include a source 112, a drain 114, and a body 116, e.g., as descried below.

In one example, the drain 114 may be connected to a drain voltage supply (VDD), and/or the source 112 and/or body 116 may be connected to a source supply voltage (VSS).

In another example, the source 112 and/or body 116 may be connected to any other bias voltage.

In some demonstrative embodiments, body 116 may include a P-type body, e.g., as described below. In other embodiments, body 116 may include an N-type body.

In some demonstrative embodiments, MOS transistor 110 may include a Lateral Double-Diffused MOS (LDMOS), e.g., as described below.

In other embodiments, MOS transistor 110 may include any other type of MOS transistor.

In some demonstrative embodiments, MOS transistor 110 may be configured to provide a technical solution to support reduced power loses of IC 102, e.g., as described below.

In one example, MOS transistor 110 may be configured to provide a technical solution to support reduced power losses due to a switch resistance of MOS transistor 110.

In another example, MOS transistor 110 may be configured to provide a technical solution to support reduced power loss due to a gate capacitance of MOS transistor 110.

In one example, an overall power loss of the gate capacitance of a MOS transistor may increase, e.g., during charging and/or discharging, for example, when an output current of the MOS transistor decreases.

In another example, an overall power loss of the gate capacitance of a MOS transistor may increase, e.g., during charging and/or discharging, for example, when a switching frequency of the MOS transistor increases.

In other embodiments, the power loss of the MOS transistor may depend on one or more additional or alternative parameters, e.g., operational parameters of the MOS transistor, and/or any other parameters.

In some demonstrative embodiments, MOS transistor 110 may include a split-gate structure 120, which may be configured, for example, to reduce a gate to drain capacitance (Qgd) of the MOS transistor 110, e.g., between the split-gate and the drain 114 of the MOS transistor 110.

In some demonstrative embodiments, split-gate structure 120 may be configured to reduce the gate to drain capacitance Qgd of the MOS transistor 110, for example, compared to the gate to drain capacitance Qgd of a MOS transistor having a unified or "non-split" gate structure ("unified-gate MOS transistor").

In some demonstrative embodiments, reducing the gate to drain capacitance Qgd may enable, for example, to achieve reduced switching losses of the MOS transistor 110.

In some demonstrative embodiments, split-gate structure 120 may include a gate which is divided into two parts, for example, a first gate portion, which may be configured for switching an inversion channel of the MOS transistor 110 between an On state and an Off state, and a second gate portion, which may be configured as a field plate, e.g., as described below.

In some demonstrative embodiments, split-gate structure 120 may include a control gate 122 and at least one voltage-controlled Field-Plate (FP) 124, e.g., as described below.

In some demonstrative embodiments, the control gate 122 may be between the source 112 and the voltage-controlled FP 124, e.g., as described below.

In some demonstrative embodiments, the control gate 122 may be configured to switch the MOS transistor 110 between an on state and an off state, for example, according to a switching voltage 123.

In some demonstrative embodiments, the voltage-controlled FP 124 may be between the control gate 122 and the drain 114, e.g., as described below.

In some demonstrative embodiments, there may be one or more disadvantages, inefficiencies, and/or technical problems in a MOS transistor ("a non-voltage-controlled MOS transistor") implementing a non-voltage-controlled split-gate structure, including a non-voltage-controlled FP, as described below.

In some demonstrative embodiments, the capacitive losses at the non-voltage-controlled MOS transistor may be reduced at a cost of conduction losses, e.g., a higher resistance of the non-voltage-controlled MOS transistor.

In some demonstrative embodiments, there may be a tradeoff between a reduction of the switching losses and a reduction of the conduction losses at the non-voltage-controlled MOS transistor, e.g., as described below.

For example, there may be a tradeoff between the gate to drain capacitance Qgd of the non-voltage-controlled MOS transistor, and a resistance, e.g., a drain-source resistance (Rdson), between a drain and a source of the non-voltage-controlled MOS transistor, for example, at the On state of the non-voltage-controlled MOS transistor, e.g., as described below.

In one example, the split-gate of the non-voltage-controlled MOS transistor may allow to reduce the gate to drain capacitance Qgd, for example, by about 50%, for example, at a cost of an increase at the drain-source resistance Rdson, e.g., of about 70%, for example, when biasing the non-voltage-controlled FP of the split-gate.

In some demonstrative embodiments, the non-voltage-controlled MOS transistor may suffer from high conduction losses, for example, as a result of the increase in the drain-source resistance Rdson, e.g., when the non-voltage-controlled FP is switched between the On state and the Off state.

In some demonstrative embodiments, the conduction losses of the non-voltage-controlled MOS transistor may increase, for example, if the non-voltage-controlled FP is connected to a VSS.

In some demonstrative embodiments, the non-voltage-controlled MOS transistor may suffer from high switching losses, for example, when the non-voltage-controlled FP is switched between the On state and the Off state.

In some demonstrative embodiments, there may be one or more disadvantages, inefficiencies, and/or technical problems in an implementation in which the field plate of the split-gate structure is controlled with a constant voltage. For example, there may be one or more disadvantages, inefficiencies, and/or technical problems in an implementation using a signal controller to provide a rising edge on the field plate a predetermined amount of time after providing a rising edge on the gate control signal, for example, to address increased Hot carrier Injection (HCI) induced by a steady bias voltage on the field plate. For example, this implementation may not be suitable to address the problem of the high power losses.

In some demonstrative embodiments, there may be one or more disadvantages, inefficiencies, and/or technical problems in an implementation, which is based on adding or removing one or more switching devices, for example, to improve power efficiency. In one example, this implementation may result in an increased die size and/or complex manufacturing of the die. In another example, this implementation may require adding several devices in parallel, which may load an output with additional capacitance.

In some demonstrative embodiments, a non-voltage-controlled MOS transistor with a non-voltage-controlled FP may show reduced power loss, for example, with respect to one or more use cases, e.g., as described below.

In some demonstrative embodiments, the non-voltage-controlled MOS transistor may show reduced power loses, for example, when using relatively high switching frequencies, e.g., above 1.5 MHZ.

In some demonstrative embodiments, the non-voltage-controlled MOS transistor may show reduced power loses, for example, when driving a relatively low load current, e.g., below 400 milliamps (ma).

Figure 2:
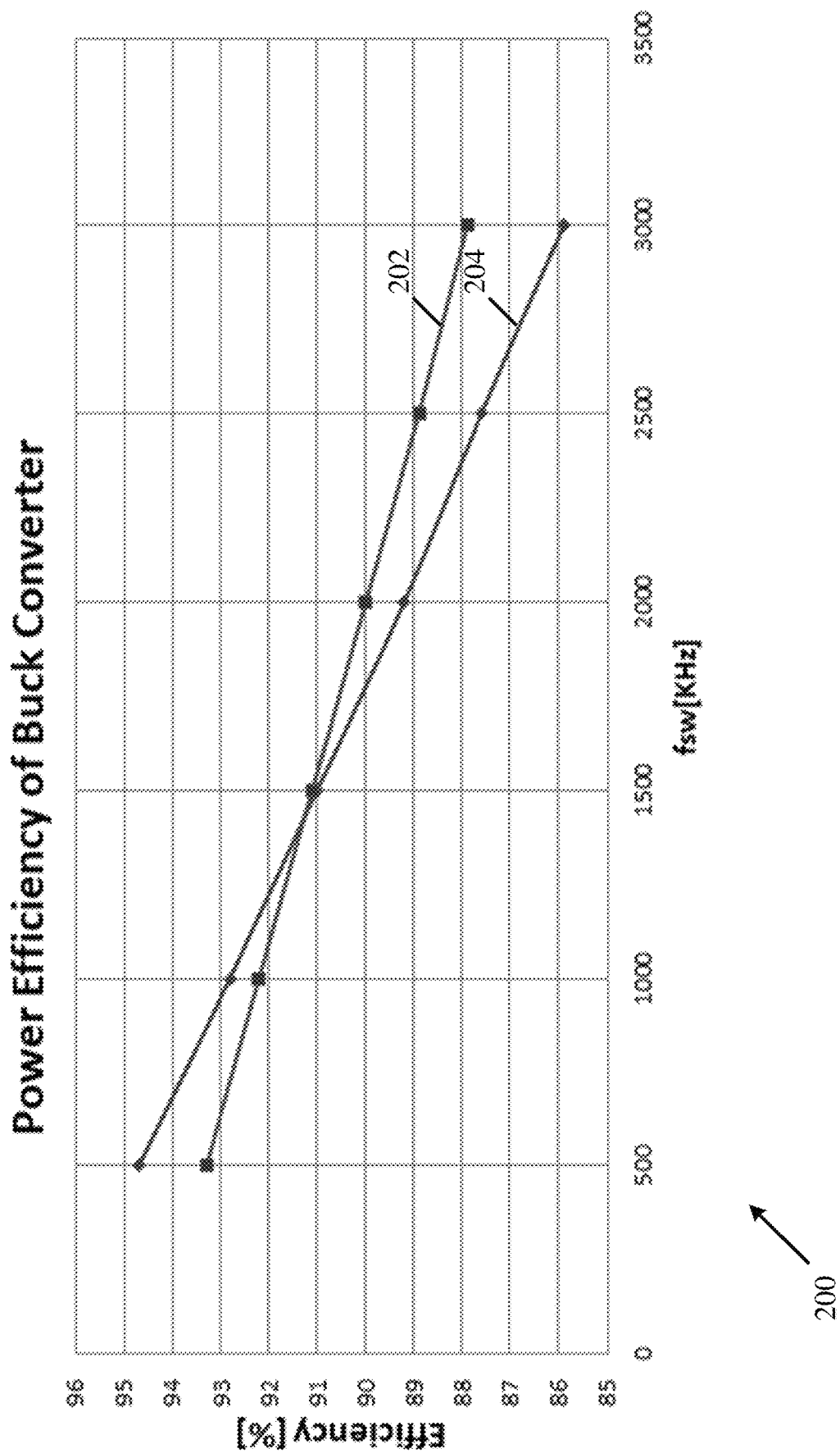
FIG. 2 is a schematic illustration of a graph depicting performance of a non-voltage-controlled split-gate Metal-Oxide-Semiconductor (MOS) transistor versus a switching frequency of the non-voltage-controlled split-gate MOS transistor, to demonstrate a technical problem, which may be addressed in accordance with some demonstrative embodiments.

Reference is made to FIG. 2, which schematically illustrates a graph 200 depicting performance of a non-voltage-controlled split-gate MOS transistor versus a switching frequency of the non-voltage-controlled split-gate MOS transistor, to demonstrate a technical problem, which may be addressed in accordance with some demonstrative embodiments.

As shown in graph 2, a curve 202 may represent performance results, e.g., in terms of efficiency %, corresponding to the non-voltage-controlled split-gate MOS transistor.

As shown in graph 2, a curve 204 may represent performance results corresponding to a unified-gate MOS transistor.

As shown in graph 2, a comparison between the curve 202 and the curve 204 shows an improved performance of the non-voltage-controlled split-gate MOS transistor compared to the performance of the unified-gate MOS transistor, for example, at frequencies above 1500 MHZ.

For example, the non-voltage-controlled split-gate MOS transistor (curve 202) may provide improved performance compared to the unified-gate MOS transistor (curve 204) at the frequencies above 1500 MHZ, for example, while maintaining a reduced gate to drain capacitance Qgd.

Figure 3:
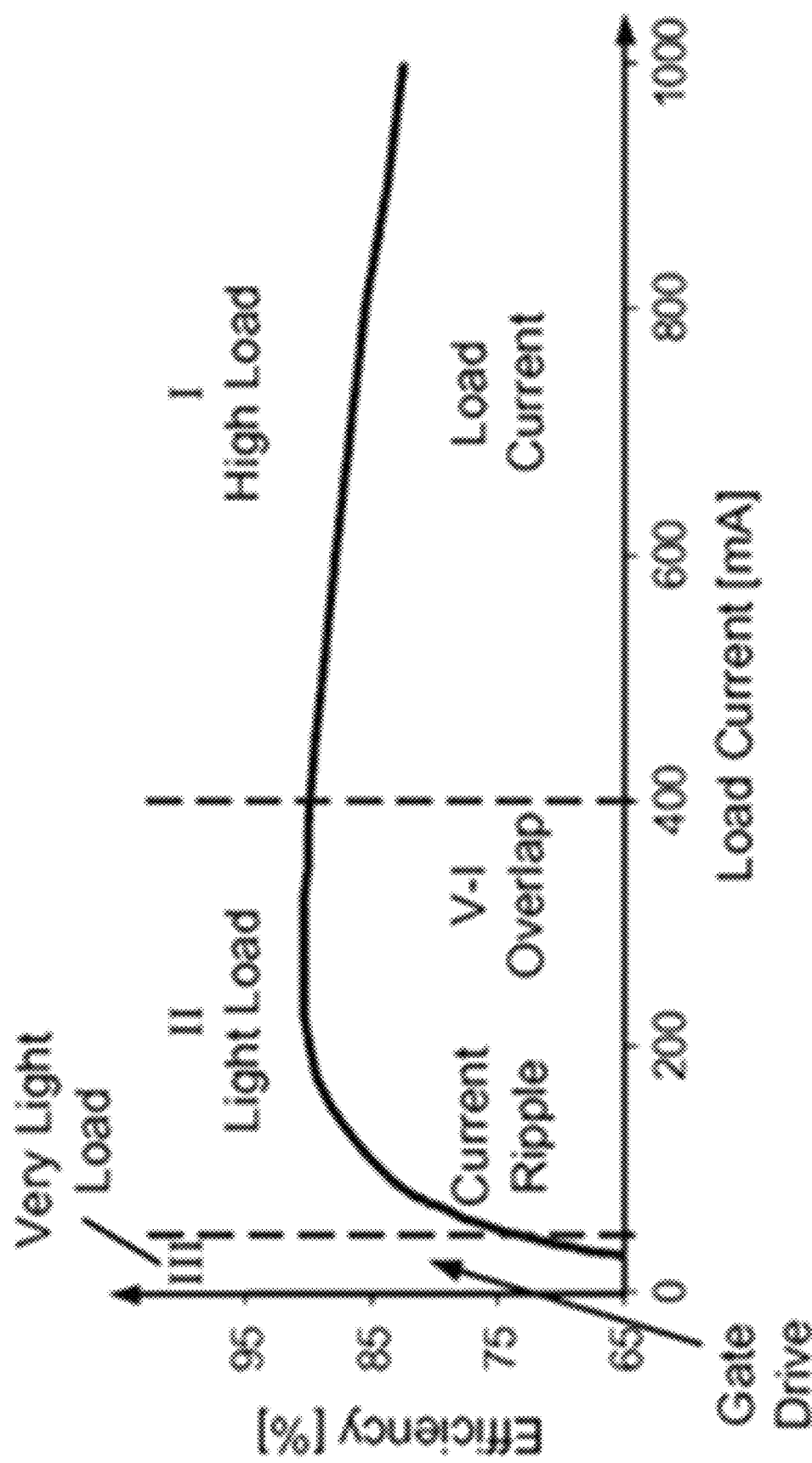
FIG. 3 is a schematic illustration of a graph depicting performance of a non-voltage-controlled split-gate MOS transistor versus a load current, to demonstrate a technical problem, which may be addressed in accordance with some demonstrative embodiments.

Reference is made to FIG. 3, which schematically illustrates a graph 300 depicting performance of a non-voltage-controlled split-gate MOS transistor versus a load current, to demonstrate a technical problem, which may be addressed in accordance with some demonstrative embodiments.

As shown in graph 3, performance of the non-voltage-controlled s split-gate MOS transistor may be improved, for example, at a relatively light load, e.g., which consumes a low load current.

As shown in graph 3, using a higher load, e.g., which consumes a high load current, or using a very light load, e.g., which consumes a very low load current, may degrade the performance of the non-voltage-controlled split-gate MOS transistor.

In some demonstrative embodiments, the degraded performance of the non-voltage-controlled split-gate MOS transistor may result, for example, from switching losses of the non-voltage-controlled split-gate structure of the MOS transistor.

Referring back to FIG. 1, in some demonstrative embodiments, split-gate structure 120 may be configured to provide a technical solution to reduce power losses of MOS transistor 110, e.g., as described below.

In some demonstrative embodiments, split-gate structure 120 may be configured, for example, to reduce, control, and/or mitigate the switching losses of MOS transistor 110, e.g., as described below.

In some demonstrative embodiments, split-gate structure 120 may be configured, for example, to reduce, control, and/or mitigate the conductive losses of MOS transistor 110, e.g., as described below.

In some demonstrative embodiments, split-gate structure 120 may be configured, for example, to reduce, control, and/or mitigate the gate to drain capacitance Qgd of MOS transistor 110, e.g., as described below.

In some demonstrative embodiments, split-gate structure 120 may be configured, for example, to reduce, control, and/or mitigate the drain-source resistance Rdson of MOS transistor 110, e.g., as described below.

In some demonstrative embodiments, split-gate structure 120 may be configured to provide one or more improved performance characteristics, e.g., compared to a performance of a non-voltage-controlled split-gate structure, e.g., as described below.

In some demonstrative embodiments, split-gate structure 120 may be implemented, for example, to significantly reduce, control, and/or mitigate one or more of the switching losses, for example, while maintaining a reduced resistance Rdson of the MOS transistor 110, e.g., as described below.

In some demonstrative embodiments, split-gate structure 120 may be implemented, for example, in a manner which may enable to control a switching voltage of voltage-controlled FP 124, for example, based on one or more control parameters, for example, to achieve an efficient power delivery of MOS transistor 110, e.g., as described below.

In some demonstrative embodiments, split-gate structure 120 may be configured, for example, in a manner which may enable to control a switching voltage of voltage-controlled FP 124, for example, based on an output current of MOS transistor 110, e.g., a load current driven by MOS transistor 110, and/or based on a switching frequency of MOS transistor 110, e.g., as described below. However, in other embodiments, split-gate structure 120 may be configured, for example, in a manner, which may enable to control a switching voltage of voltage-controlled FP 124 based on any other additional or alternative control parameter.

In some demonstrative embodiments, IC 102 may include a voltage controller 150 configured to apply a variable control voltage 152 (also referred to as "a variable switching controlled voltage") to the voltage-controlled FP 124, e.g., as described below.

In some demonstrative embodiments, voltage controller 150 may be configured to apply the variable control voltage 152 to the voltage-controlled FP 124, for example, based on at least one control parameter, e.g., as described below.

In some demonstrative embodiments, the at least one control parameter may include a load current driven by the MOS transistor 110, e.g., as described below.

In some demonstrative embodiments, the at least one control parameter may include a switching frequency of the switching voltage 123, e.g., to switch the MOS transistor 110, e.g., as described below.

In other embodiments, the at least one control parameter may include any other additional or alternative control parameter.

In some demonstrative embodiments, voltage controller 150 may be configured to receive a feedback signal based on the load current, and to provide the variable control voltage 152 to the voltage-controlled FP 124, for example, based on the feedback signal, e.g., as described below.

In some demonstrative embodiments, voltage controller 150 may be configured to receive a frequency indication, for example, based on the switching frequency of MOS transistor 110, and to provide the variable control voltage 152 to the voltage-controlled FP 124, for example, based on the frequency indication, e.g., as described below.

In some demonstrative embodiments, voltage controller 150 may be configured to set the variable control voltage 152, for example, when the MOS transistor 110 is at the on state, e.g., as described below.

In some demonstrative embodiments, voltage controller 150 may be configured to set the variable control voltage, for example, within a range of voltage levels having a maximal voltage level of 5 Volts (V), e.g., as described below.

In other embodiments, voltage controller 150 may be configured to set the variable control voltage, for example, within a range of voltage levels having any other maximal voltage level.

In some demonstrative embodiments, voltage controller 150 may be configured to set the variable control voltage, for example, within a range of voltage levels having a minimal voltage level of 0 Volts, e.g., as described below.

In other embodiments, voltage controller 150 may be configured to set the variable control voltage 152, for example, within a range of voltage levels having any other minimal voltage level.

In some demonstrative embodiments, voltage controller 150 may be configured to set the variable control voltage, for example, within a range of voltage levels between 0 Volts and 5 Volts.

In other embodiments, voltage controller 150 may be configured to set the variable control voltage, for example, within any other range of voltage levels.

In some demonstrative embodiments, for example, voltage controller 150 may monitor the load current driven by MOS transistor 110 and/or the switching frequency of MOS transistor 110. For example, voltage controller 150 may monitor the load current driven by MOS transistor 110 based on an output current of IC 102.

In some demonstrative embodiments, for example, voltage controller 150 may determine whether to maintain the voltage-controlled FP 124, for example, at a voltage first level, e.g., a level of 0V, or to apply to voltage-controlled FP 124 a second voltage level in a predefined range, e.g., a voltage between 0V and 5V, for example, to optimize power consumption of MOS transistor 110.

In some demonstrative embodiments, voltage controller 150 may be configured to select to maintain the voltage-controlled FP 124 at the first voltage level, e.g., a level of 0V, for example, when MOS transistor 110 delivers a light load, and/or when the switching frequency of MOS transistor 110 is relatively high.

In some demonstrative embodiments, voltage controller 150 may be configured to dynamically change the variable control voltage 152, for example, based on a predefined control function, which may be based on the at least one control parameter, e.g., as described below.

In some demonstrative embodiments, the predefined control function may define a minimal voltage level corresponding to a first predefined level of the control parameter, e.g., as described below.

In some demonstrative embodiments, the predefined control function may define a maximal voltage level corresponding to a second predefined level of the control parameter, e.g., as described below.

In some demonstrative embodiments, the predefined control function may define a monotonic change of the control voltage between the minimal voltage level and the maximal voltage level corresponding, for example, to a change of the control parameter from the first predefined level of the control parameter to the second predefined level of the control parameter, e.g., as described below.

In one example, the predefined control function may define a voltage level of 0V corresponding to a load current of 0 milli-Ampere (ma), a voltage level of 5V corresponding to a load current of 400 ma, and a monotonic change of the control voltage between 0V and 5V corresponding to a change in of the load current from 0 ma to 400 ma.

In other embodiments, any other minimal voltage level, maximal voltage level and/or control function may be implemented.

In some demonstrative embodiments, voltage controller 150 may be configured to set the variable control voltage 152 to a first voltage level, for example, based on a first load current driven by the MOS transistor 110, and to set the variable control voltage 152 to a second voltage level based on a second load current driven by the MOS transistor. For example, the second load current may be greater than the first load current, and the second voltage level may be greater than the first voltage level, e.g., as described below.

In one example, voltage controller 150 may set the variable control voltage 152 to 3V, for example, based on a load current of 300 ma driven by the MOS transistor 110, and/or voltage controller 150 may set the variable control voltage 152 to 5V, for example, based on a load current of 400 ma driven by the MOS transistor.

In some demonstrative embodiments, voltage controller 150 may be configured to dynamically change the variable control voltage 152, for example, based on a change in the load current, e.g., as described below.

In some demonstrative embodiments, voltage controller 150 may be configured to increase a voltage level of the variable control voltage 152, for example, based on an increase in the load current, e.g., as described below.

In some demonstrative embodiments, voltage controller 150 may be configured to decrease the voltage level of the variable control voltage 152, for example, based on a decrease in the load current, e.g., as described below.

In some demonstrative embodiments, voltage controller 150 may be configured to dynamically change the variable control voltage, for example, based on a change in the switching frequency of the switching voltage 123, e.g., as described below.

In some demonstrative embodiments, voltage controller 150 may be configured to increase the voltage level of the variable control voltage 152, for example, based on a decrease in the switching frequency of the switching voltage 123.

In some demonstrative embodiments, voltage controller 150 may be configured to decrease the voltage level of the variable control voltage 152, for example, based on an increase in the switching frequency of the switching voltage 123.

In some demonstrative embodiments, voltage controller 150 may be configured to set the variable control voltage 152 to a first voltage level based on a first switching frequency of the switching voltage 123, and to set the variable control voltage to a second voltage level based on a second switching frequency of the switching voltage 123. For example, the second switching frequency may be greater than the first switching frequency, and the second voltage level may be lower than the first voltage level.

In one example, voltage controller 150 may set the variable control voltage 152 to a 2V, for example, based on a switching frequency of 2000 Mhz, and/or voltage controller 150 may set the variable control voltage 152 to 5V based on a switching frequency of 500 Mhz.

In some demonstrative embodiments, the MOS transistor 100 may include more than one voltage-controlled field plate 124, e.g., as described below.

In some demonstrative embodiments, split-gate structure 120 may include a plurality of voltage-controlled FPs 124, e.g., as described below.

In some demonstrative embodiments, voltage controller 150 may be configured to set, based on the control parameter, one or more variable control voltages to control one or more of the plurality of voltage-controlled FPs 124.

In some demonstrative embodiments, voltage controller 150 may be configured to set, based on the control parameter, a plurality of variable control voltages to control the plurality of voltage-controlled FPs, respectively.

In some demonstrative embodiments, the implementation of the voltage controlled FP 124 may provide a technical solution to support implementation of MOS transistor 110 for a wide range of switching frequencies, which may allow a relatively wide range of output loads resulting in a flexible product.

In some demonstrative embodiments, the implementation of the voltage controlled FP 124 may provide a technical solution to support implementation of MOS transistor 110 for switch mode converters supporting a wide range of switching frequencies.

In some demonstrative embodiments, the implementation of the voltage controlled FP 124 may provide a technical solution to improve a power consumption of IC 102, for example, for a relatively light load, for example, while maintaining a power efficiency, e.g., for a relatively high load.

Figure 4:
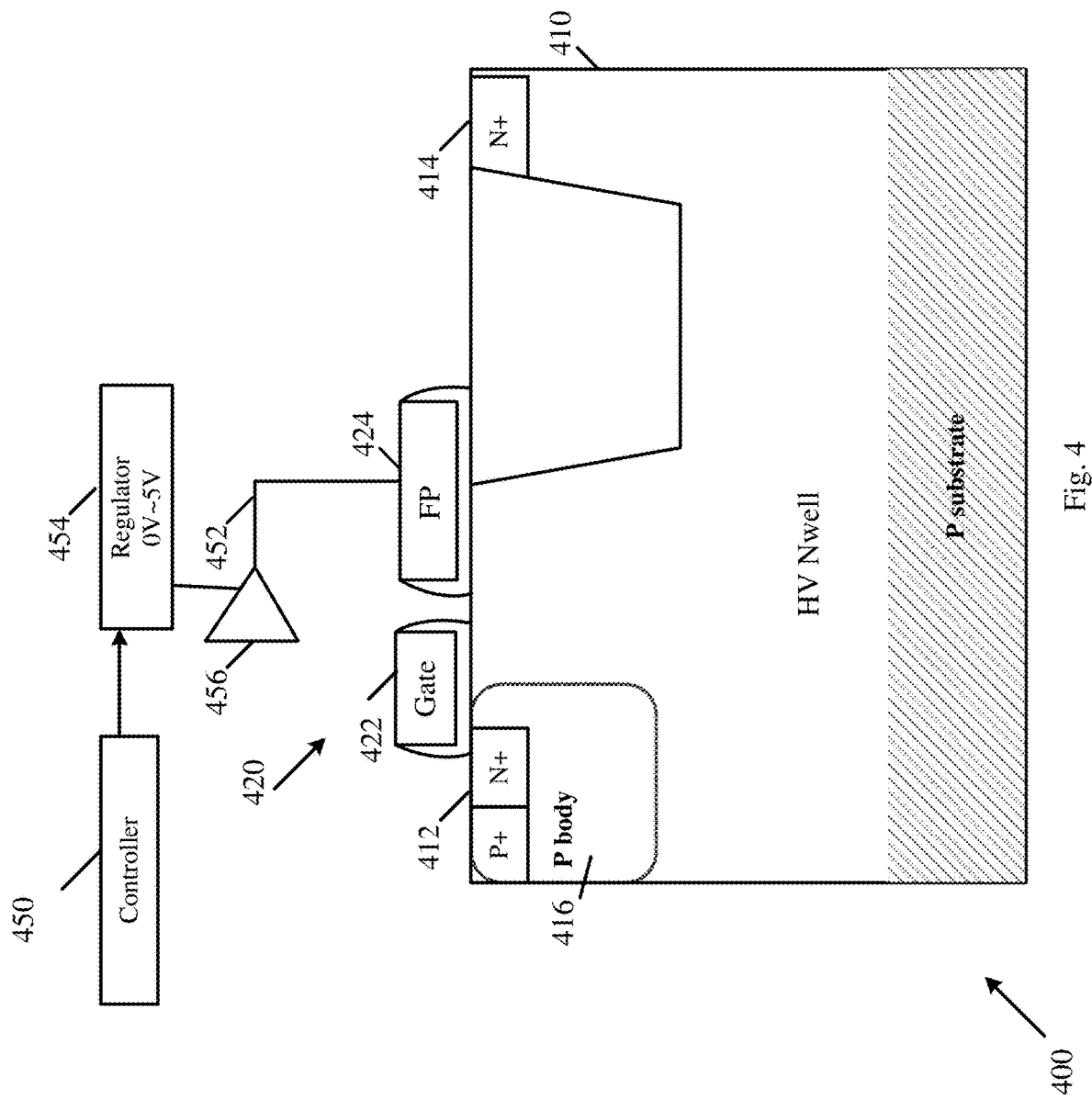
FIG. 4 is a schematic illustration of an Integrated Chip (IC) including a MOS transistor with a voltage-controlled Field Plate (FP), in accordance with some demonstrative embodiments.

Reference is made to FIG. 4, which schematically illustrates an IC 400 including a MOS transistor 410 with a voltage-controlled FP 424, in accordance with some demonstrative embodiments.

For example, IC 102 (FIG. 1) may include, and/or may perform the functionality of, one or more operations of, and/or the role of, IC 400.

For example, MOS transistor 110 (FIG. 1) may include, and/or may perform the functionality of, one or more operations of, and/or the role of, MOS transistor 410.

In some demonstrative embodiments, as shown in FIG. 4, MOS transistor 410 may include a source 412, a drain 414, a body 416, and a split-gate structure 420.

In some demonstrative embodiments, as shown in FIG. 4, body 416 may include a P-type body.

In other embodiments, body 416 may include an N-type body.

In some demonstrative embodiments, as shown in FIG. 4, split-gate structure 420 may include a control gate 422 and at least one voltage-controlled FP 424.

In some demonstrative embodiments, as shown in FIG. 4, the control gate 422 may be between the source 412 and the voltage-controlled FP 424, and the voltage-controlled FP 424 may be between the control gate 422 and the drain 414.

In some demonstrative embodiments, as shown in FIG. 4, IC 400 may include a voltage controller 450 configured to apply a variable control voltage 452 to the voltage-controlled FP 424. For example, voltage controller 150 (FIG. 1) may include, and/or may perform the functionality of, one or more operations of, and/or the role of, voltage controller 450.

In some demonstrative embodiments, as shown in FIG. 4, voltage controller 450 may apply the variable control voltage 452 to FP 424, for example, via a voltage regulator 454 and/or a voltage driver 456.

In some demonstrative embodiments, as shown in FIG. 4, voltage regulator 452 may be configured to provide variable control voltage 452 as a regulated voltage within a range of voltage levels, for example, a range between 0V and 5V and/or any other range, for example, based on a voltage level of variable control voltage 452, which may be set by voltage controller 450.

In some demonstrative embodiments, as shown in FIG. 4, driver 456 may be configured to drive the regulated voltage 452 to the voltage-controlled FP 424.

In some demonstrative embodiments, the variable control voltage 452 may be applied to the voltage-controlled FP 424 via a voltage regulator and a voltage driver, e.g., voltage regulator 454 and a driver 456, e.g., as shown in FIG. 4. However, in other embodiments, any other method, configuration, and/or scheme may be implemented, for example, to apply the variable control voltage 452 to the voltage-controlled FP 424.

Figure 5:
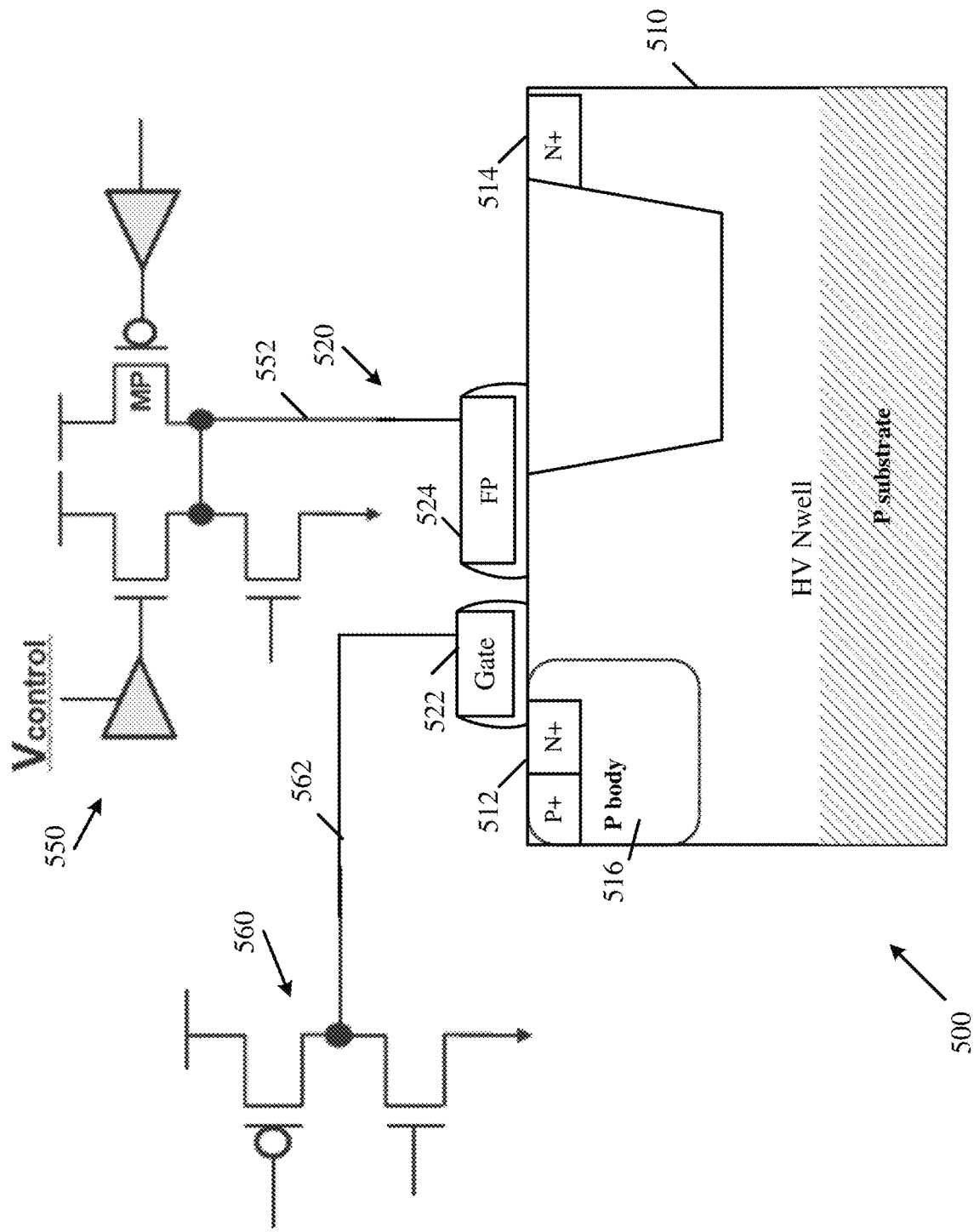
FIG. 5 is a schematic illustration of an IC including a MOS transistor with a voltage-controlled FP, in accordance with some demonstrative embodiments.

Reference is made to FIG. 5, which schematically illustrates an IC 500 including a MOS transistor 510 with a voltage-controlled FP 524, in accordance with some demonstrative embodiments.

For example, IC 102 (FIG. 1) may include, and/or may perform the functionality of, one or more operations of, and/or the role of, IC 500.

For example, MOS transistor 110 (FIG. 1) may include, and/or may perform the functionality of, one or more operations of, and/or the role of, MOS transistor 510.

In some demonstrative embodiments, as shown in FIG. 5, MOS transistor 510 may include a source 512, a drain 514, a body 516, and a split-gate structure 520.

In some demonstrative embodiments, as shown in FIG. 5, body 516 may include a P-type body.

In other embodiments, body 516 may include an N-type body.

In some demonstrative embodiments, as shown in FIG. 5, split-gate structure 520 may include a control gate 522 and at least one voltage-controlled FP 524.

In some demonstrative embodiments, as shown in FIG. 5, the control gate 522 may be between the source 512 and the voltage-controlled FP 524, and the voltage-controlled FP 524 may be between the control gate 522 and the drain 514.

In some demonstrative embodiments, as shown in FIG. 5, IC 500 may include a voltage controller 550, which may be configured to apply a variable control voltage 552 to the voltage-controlled FP 524. For example, voltage controller 150 (FIG. 1) may include, and/or may perform the functionality of, one or more operations of, and/or the role of, the voltage controller 550.

In some demonstrative embodiments, as shown in FIG. 5, IC 500 may include switching voltage circuitry 560, which may be configured to provide a switching voltage 562 to switch the MOS transistor 510 between the on state and the off state.

In some demonstrative embodiments, voltage controller 550 may be configured to set the variable control voltage 552, for example, when the MOS transistor 510 is set by switching voltage circuitry 560 to the on state, e.g., as described below.

In some demonstrative embodiments, voltage controller 550 may be configured to control the voltage applied to voltage-controlled FP 524, for example, in parallel to the switching of the control gate 522, e.g., by switching voltage circuitry 560.

In some demonstrative embodiments, voltage controller 550 may be configured to control the voltage applied to the voltage-controlled FP 524, for example, based on the switching frequency applied by the switching voltage circuitry 560, and/or based on the load current delivered by MOS transistor 510.

Figure 6A:
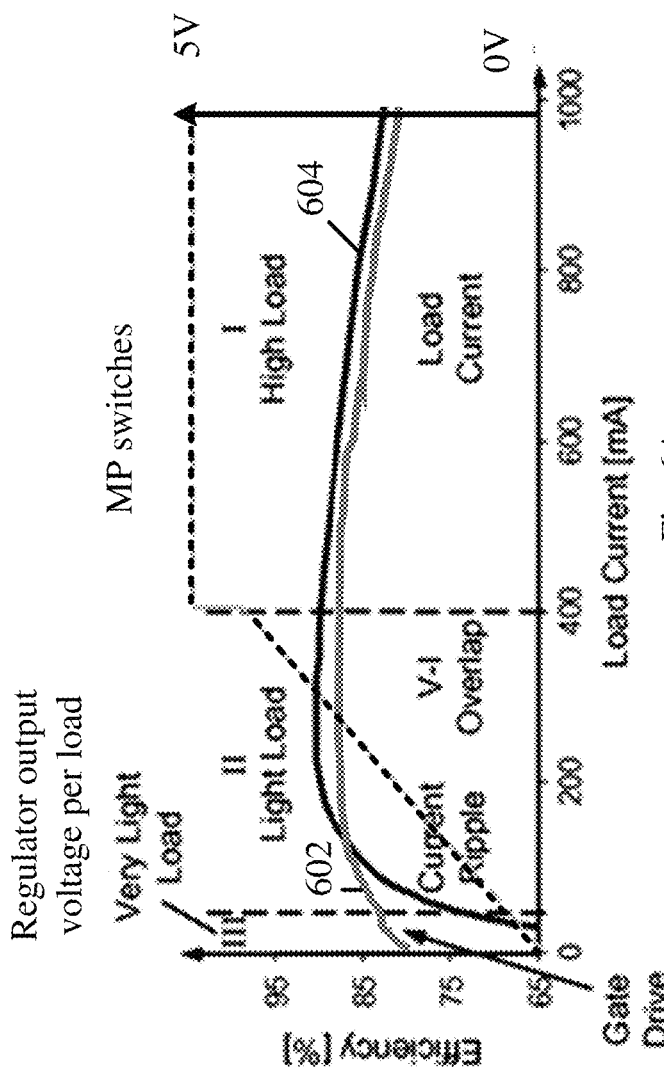
FIG. 6A is a schematic illustration of a graph depicting performance of a MOS transistor with a voltage-controlled FP, in accordance with some demonstrative embodiments.

Reference is made to FIG. 6A, which schematically illustrates a graph 600 depicting performance of a MOS transistor with a voltage-controlled FP, in accordance with some demonstrative embodiments.

Figure 6B:
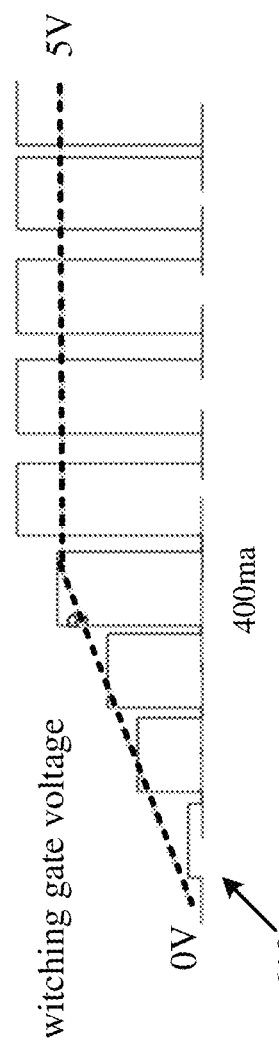
FIG. 6B is a schematic illustration of a control function to control a voltage-controlled FP, in accordance with some demonstrative embodiments.

Reference is made to FIG. 6B, which schematically illustrates a control function 610 to control a voltage-controlled FP, in accordance with some demonstrative embodiments.

In some demonstrative embodiments, as shown in FIG. 6A, a curve 602 may represent performance of the MOS transistor including a voltage-controlled FP versus a load current driven by the MOS transistor, for example, when the voltage-controlled FP is controlled, for example, based on control function 610.

In some demonstrative embodiments, as shown in FIG. 6A, a curve 604 may represent performance of a non-voltage-controlled MOS transistor implementing a non-voltage-controlled FP versus a load current driven by the non-voltage-controlled MOS transistor.

In one example, curve 602 may represent performance of MOS transistor 110 (FIG. 1), for example, when the variable control voltage 152 (FIG. 1) is set, for example, based on control function 610.

In some demonstrative embodiments, as shown in FIG. 6B, the control function 610 may define a minimal voltage level of 0 v corresponding to a load current of 0 ma driven by the MOS transistor.

In some demonstrative embodiments, as shown in FIG. 6B, the control function 610 may define a maximal voltage level of 5V corresponding to a load current of 400 ma driven by the MOS transistor.

In some demonstrative embodiments, as shown in FIG. 6B, the control function 610 may define a monotonic change of the control voltage between 0 v and 5V corresponding, for example, to a change of the load current from 0 ma to 400 ma.

In some demonstrative embodiments, as shown in FIG. 6A, the MOS transistor including the voltage-controlled FP (curve 602) may provide a performance comparable to the performance of the non-voltage-controlled MOS transistor (curve 604), for example, in case of a light load current or a heavy load, e.g., a load current of above about 100 ma.

In some demonstrative embodiments, as shown in FIG. 6A, the MOS transistor including the voltage-controlled FP (curve 602) may provide significantly improved performance, for example compared to the performance of the non-voltage-controlled MOS transistor (curve 604), for example, in case of a very light load current, e.g., a load current of less than about 100 ma, for example, due to reduction of switching loses.

Figure 7:
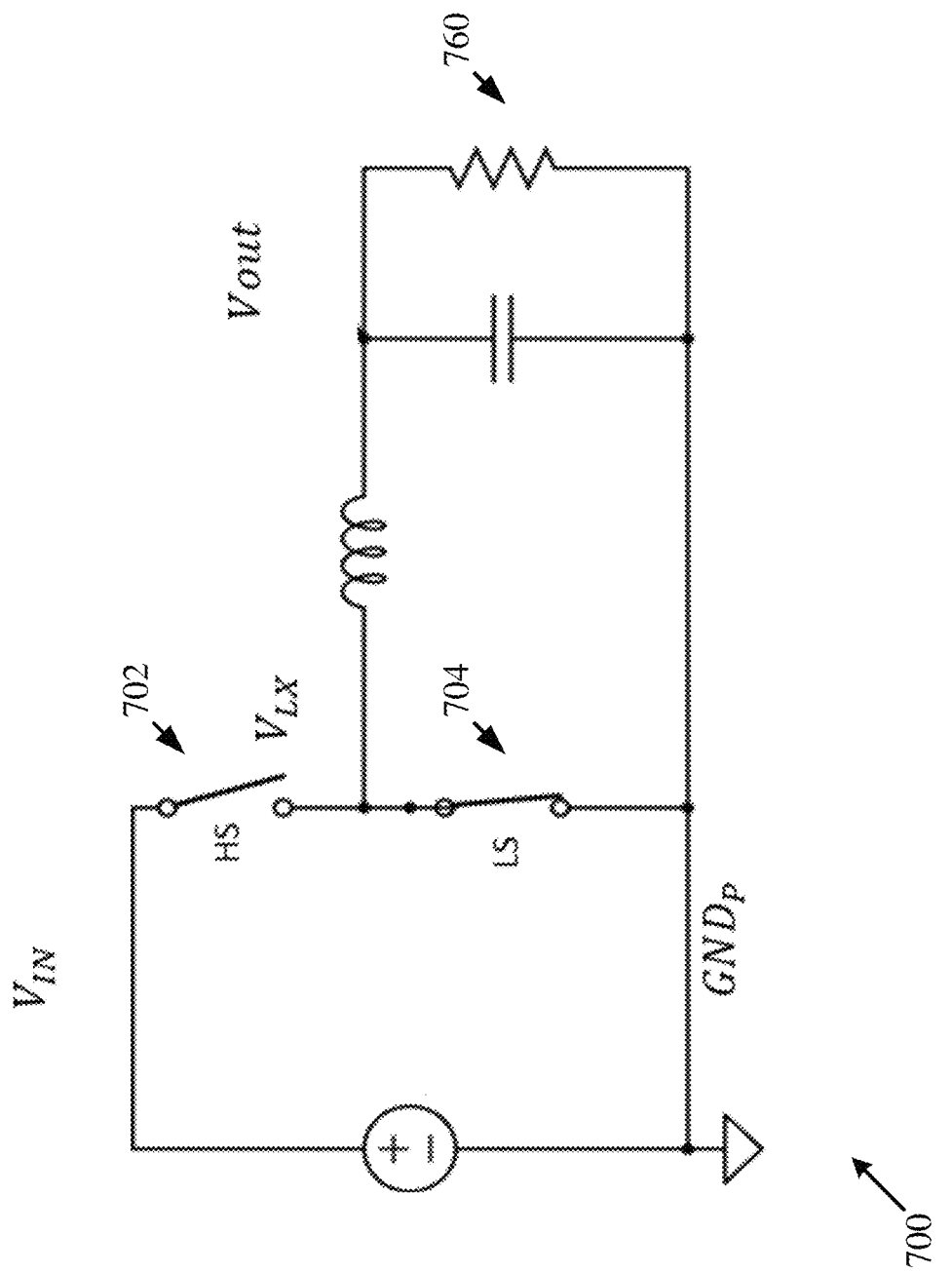
FIG. 7 is a schematic illustration of a switch mode converter, which may be implemented in accordance with some demonstrative embodiments.

Reference is made to FIG. 7, which schematically illustrate a switch mode converter 700, which may be implemented in accordance with some demonstrative embodiments.

In some demonstrative embodiments, as shown in FIG. 7, switch mode converter 700 may be configured to supply voltage to a load 710.

In some demonstrative embodiments, as shown in FIG. 7, switch mode converter 700 may include a HS switch 702 and a LS switch 704.

In some demonstrative embodiments, HS switch 702 may include a first MOS transistor including a first split-gate structure including a first control gate and a first voltage-controlled FP.

In some demonstrative embodiments, LS switch 704 may include a second MOS transistor including a second split-gate structure including a second control gate and a second voltage-controlled FP.

In some demonstrative embodiments, switch mode converter 700 may include at least one voltage controller to apply at least one variable control voltage to the first and/or second voltage-controlled FPs.

In one example, switch mode converter 700 may include a single voltage controller to apply a first variable control voltage to the first voltage-controlled FP, and to apply a second variable control voltage to the second voltage-controlled FP.

In another example, switch mode converter 700 may include a first voltage controller, e.g., corresponding to the HS switch 702, and a second voltage controller, e.g., corresponding to the LS switch 704. For example, the first voltage controller may apply a first variable control voltage to the first voltage-controlled FP, and the second voltage controller to apply a second variable control voltage to the second voltage-controlled FP.

In some demonstrative embodiments, the voltage controller may be configured to apply the variable control voltage to the first and/or second voltage-controlled FPs, for example, based on a load current via load 760, and/or a switching frequency of switch mode converter 700.

In some demonstrative embodiments, implementation of the voltage controlled FP, e.g., as described above, may provide a technical solution to provide switch mode converter 700 capable of supporting a wide range of switching frequencies, which may allow a relatively wide range of output loads, resulting in a flexible product.

In some demonstrative embodiments, implementation of the voltage controlled FP, e.g., as described above, may provide a technical solution to provide switch mode converter 700 having an improved power consumption, for example, for a light load, while maintaining a power efficiency, e.g., for a high load.

Figure 8:
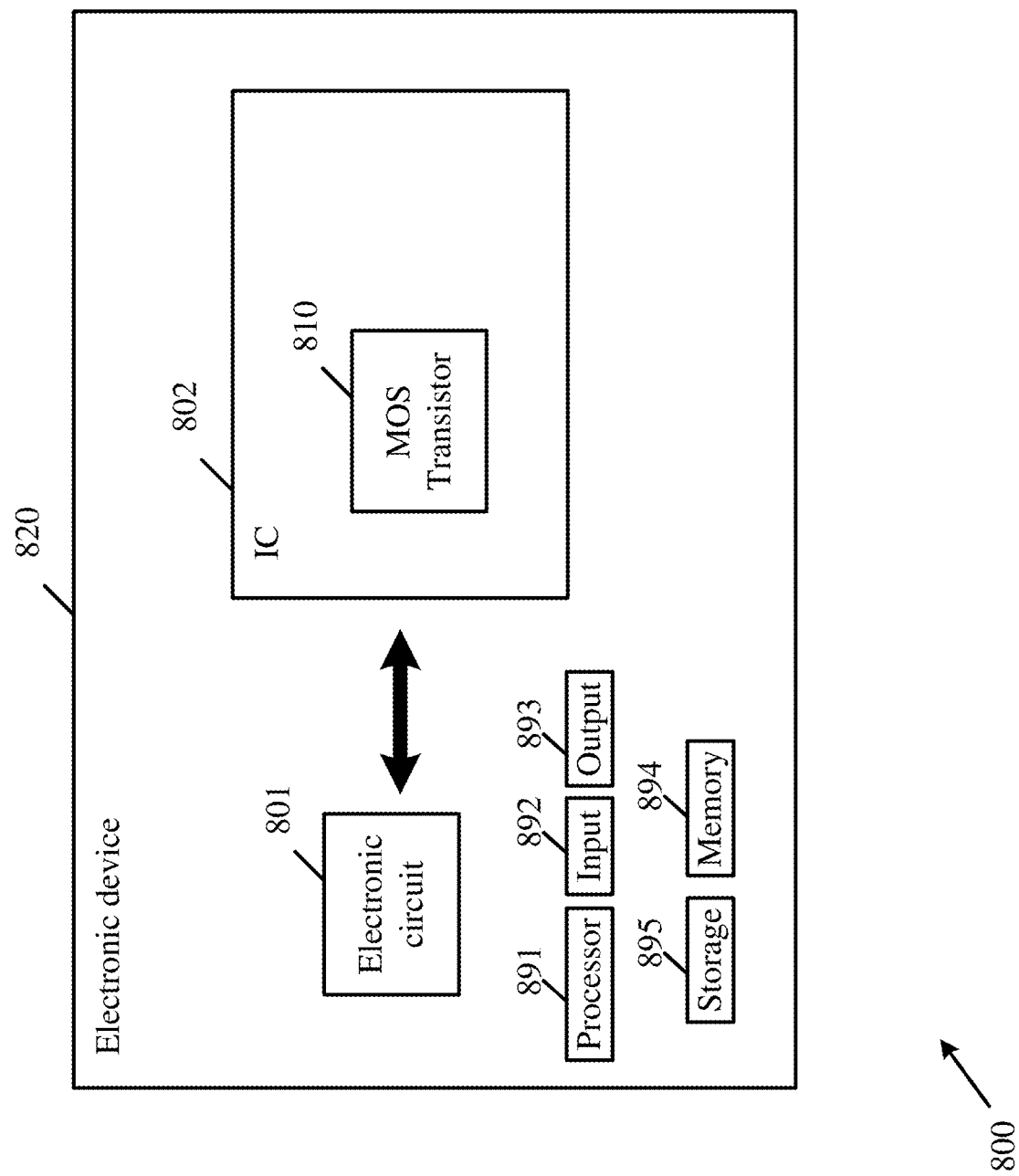
FIG. 8 is a schematic block diagram illustration of an electronic device, in accordance with some demonstrative embodiments.

Reference is made to FIG. 8, which schematically illustrates a block diagram of an electronic device 800, in accordance with some demonstrative embodiments.

In some demonstrative embodiments, electronic device 800 may include, for example, a computing device, an electrical device, a mobile device, a mobile phone, a Smartphone, a mobile computer, a laptop computer, a notebook computer, a tablet computer, a handheld computer, an Internet of Things (IoT) device, a sensor device, a handheld device, a wearable device, a gaming device, digital camera, a media player, a music player, or the like.

In some demonstrative embodiments, electronic device 800 may include an electronic circuit 801 configured to perform one more functionalities of electronic device 800.

In some demonstrative embodiments, electronic device 800 may include an Integrated Circuit (IC) 802 configured to manage power of electronic circuit 801. For example, IC 802 may include, perform the functionality of, one or more operations of, and/or the role of IC 82 (FIG. 1).

In some demonstrative embodiments, IC 802 may include a MOS IC formed on a wafer.

In some demonstrative embodiments, IC 802 may include a switch mode converter configured to manage the power of electronic circuit 801.

In some demonstrative embodiments, the switch mode converter may include a MOS transistor 810, which may be operable as a switching transistor of the switch mode converter.

For example, MOS transistor 810 (FIG. 1) may include, and/or may perform the functionality of, one or more operations of, and/or the role of MOS transistor 110 (FIG. 1).

In some demonstrative embodiments, IC 802 may be included, and/or may be implemented, as part of electronic circuit 801.

In one example, electronic circuit 801 may include a SoC including IC 802.

In some demonstrative embodiments, IC 802 and electronic circuit 801 may be implemented as separate elements of device 802.

In one example, electronic device 800 may include an electronic circuit board including IC 802 and electronic circuit 801, which may be connected using one or more interconnectors, tracers, and/or wires.

In some demonstrative embodiments, electronic device 800 may also include, for example, one or more of a processor 891, an input unit 892, an output unit 893, a memory unit 894, and/or a storage unit 895. Electronic device 800 may optionally include other suitable hardware components and/or software components. In some demonstrative embodiments, some or all of the components of one or more of electronic device 800 may be enclosed in a common housing or packaging, and may be interconnected or operably associated using one or more wired or wireless links.

In some demonstrative embodiments, processor 891 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 891 may execute instructions, for example, of an Operating System (OS) of electronic device 800 and/or of one or more suitable applications.

In some demonstrative embodiments, input unit 892 may include, for example, a keyboard, a keypad, a mouse, a touch-screen, a touch-pad, a track-ball, a stylus, a microphone, or other suitable pointing device or input device. Output unit 893 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 894 may include, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 895 may include, for example, a hard disk drive, a floppy disk drive, a Compact Disk (CD) drive, a CD-ROM drive, a DVD drive, or other suitable removable or non-removable storage units. Memory unit 894 and/or storage unit 895, for example, may store data processed by electronic device 800.

Figure 9:
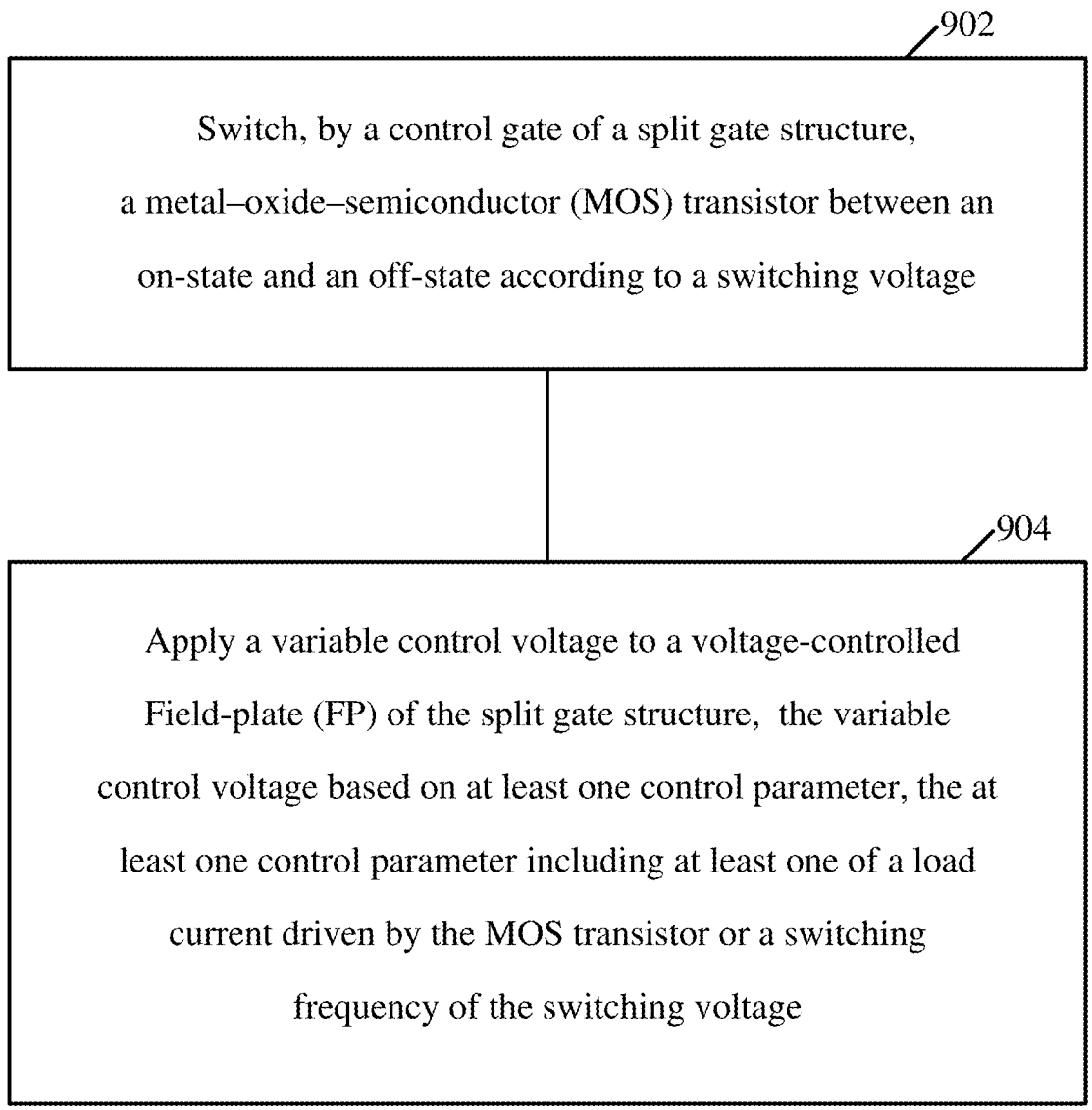
FIG. 9 is a schematic flow-chart illustration of a method of controlling a MOS transistor, in accordance with some demonstrative embodiments.

Reference is made to FIG. 9, which schematically illustrates a method of controlling a MOS transistor, in accordance with some demonstrative embodiments. For example, one or more of the operations of the method of FIG. 9 may be performed by one or more elements of an electronic device, e.g., electronic device 800 (FIG. 8), an apparatus, e.g., apparatus 100 (FIG. 1), an IC, e.g., IC 102 (FIG. 1), a switch mode converter, e.g., switch mode converter 700 (FIG. 7), and/or a voltage controller, e.g., voltage controller 150 (FIG. 1).

As indicated at block 902, the method may include switching, by a control gate of a split-gate structure, the MOS transistor between an on state and an off state according to a switching voltage. For example, control gate 122 (FIG. 1) may switch the MOS transistor 110 (FIG. 1) between the on state and the off state according to the switching voltage 123 (FIG. 1), e.g., as described above.

As indicated at block 904, the method may include applying a variable control voltage to a voltage-controlled FP of the split-gate structure, the variable control voltage based on at least one control parameter, the at least one control parameter including at least one of a load current driven by the MOS transistor or a switching frequency of the switching voltage. For example, voltage controller 150 (FIG. 1) may apply the variable control voltage 152 (FIG. 1) to the voltage-controlled FP 124 (FIG. 1), the variable control voltage 152 (FIG. 1) may be based on the control parameter including the load current driven by the MOS transistor 110 (FIG. 1) and/or the switching frequency of the switching voltage 123 (FIG. 1), e.g., as described above.

Figure 10:
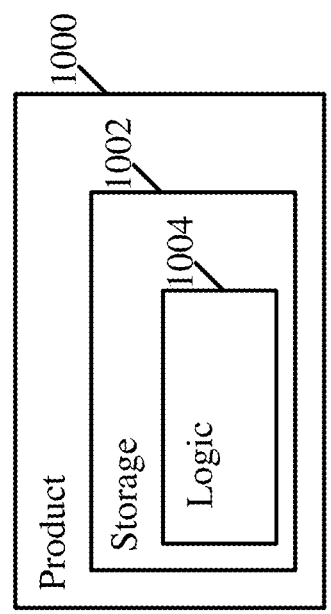
FIG. 10 is a schematic illustration of a product of manufacture, in accordance with some demonstrative embodiments.

Reference is made to FIG. 10, which schematically illustrates a product of manufacture 1000, in accordance with some demonstrative embodiments. Product 1000 may include one or more tangible computer-readable ("machine-readable") non-transitory storage media 1002, which may include computer-executable instructions, e.g., implemented by logic 1004, operable to, when executed by at least one computer processor, enable the at least one computer processor to implement one or more operations at electronic device 800 (FIG. 8), apparatus 100 (FIG. 1), IC 102 (FIG. 1), switch mode converter 700 (FIG. 7) and/or voltage controller 150 (FIG. 1). Additionally or alternatively, storage media 1002, which may include computer-executable instructions, e.g., implemented by logic 1004, operable to, when executed by at least one computer processor, enable the at least one computer processor to cause electronic device 800 (FIG. 8), apparatus 100 (FIG. 1), IC 102 (FIG. 1), switch mode converter 700 (FIG. 7) and/or voltage controller 150 (FIG. 1), to perform, trigger and/or implement one or more operations and/or functionalities, e.g., as described herein. Additionally or alternatively, storage media 1002, which may include computer-executable instructions, e.g., implemented by logic 1004, operable to, when executed by at least one computer processor, enable the at least one computer processor to perform, trigger and/or implement one or more operations and/or functionalities described with reference to the FIGS. 1, 2, 3, 4, 5, 6, 7, 8 and/or 9, and/or one or more operations described herein. The phrases "non-transitory machine-readable medium" and "computer-readable non-transitory storage media" may be directed to include all computer-readable media, with the sole exception being a transitory propagating signal.

In some demonstrative embodiments, product 1000 and/or storage media 1002 may include one or more types of computer-readable storage media capable of storing data, including volatile memory, non-volatile memory, removable or non-removable memory, erasable or non-erasable memory, writeable or re-writeable memory, and the like. For example, storage media 1002 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 1004 may include instructions, data, and/or code, which, if executed by a machine, may cause the machine to perform a method, process, and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 1004 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner, or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

EXAMPLES

The following examples pertain to further embodiments.

Example 1 includes an Integrated Circuit (IC) comprising a metal-oxide-semiconductor (MOS) transistor, the MOS transistor comprising a body; a source; a drain; and a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and a voltage controller configured to apply a variable control voltage to the voltage-controlled FP, the variable control voltage based on at least one control parameter, the at least one control parameter comprising at least one of a load current driven by the MOS transistor or a switching frequency of the switching voltage.

Example 2 includes the subject matter of Example 1, and optionally, wherein the voltage controller is configured to set the variable control voltage to a first voltage level based on a first load current driven by the MOS transistor, and to set the variable control voltage to a second voltage level based on a second load current driven by the MOS transistor, the second load current greater than the first load current, the second voltage level is greater than the first voltage level.

Example 3 includes the subject matter of Example 1 or 2, and optionally, wherein the voltage controller is configured to dynamically change the variable control voltage based on a change in the load current.

Example 4 includes the subject matter of any one of Examples 1-3, and optionally, wherein the voltage controller is configured to increase a voltage level of the variable control voltage based on an increase in the load current.

Example 5 includes the subject matter of any one of Examples 1-4, and optionally, wherein the voltage controller is configured to decrease a voltage level of the variable control voltage based on a decrease in the load current.

Example 6 includes the subject matter of any one of Examples 1-5, and optionally, wherein the voltage controller is configured to dynamically change the variable control voltage based on a change in the switching frequency of the switching voltage.

Example 7 includes the subject matter of any one of Examples 1-6, and optionally, wherein the voltage controller is configured to set the variable control voltage to a first voltage level based on a first switching frequency of the switching voltage, and to set the variable control voltage to a second voltage level based on a second switching frequency of the switching voltage, the second switching frequency greater than the first switching frequency, the second voltage level is lower than the first voltage level.

Example 8 includes the subject matter of any one of Examples 1-7, and optionally, wherein the voltage controller is configured to increase a voltage level of the variable control voltage based on a decrease in the switching frequency of the switching voltage.

Example 9 includes the subject matter of any one of Examples 1-8, and optionally, wherein the voltage controller is configured to decrease a voltage level of the variable control voltage based on an increase in the switching frequency of the switching voltage.

Example 10 includes the subject matter of any one of Examples 1-9, and optionally, wherein the voltage controller is configured to dynamically change the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

Example 11 includes the subject matter of any one of Examples 1-10, and optionally, wherein the voltage controller is configured to receive a feedback signal based on the load current, and to provide the variable control voltage to the voltage-controlled FP based on the feedback signal.

Example 12 includes the subject matter of any one of Examples 1-11, and optionally, wherein the voltage controller is configured to receive a frequency indication based on the switching frequency, and to provide the variable control voltage to the voltage-controlled FP based on the frequency indication.

Example 13 includes the subject matter of any one of Examples 1-12, and optionally, wherein the voltage controller is configured to set the variable control voltage when the MOS transistor is at the on state.

Example 14 includes the subject matter of any one of Examples 1-13, and optionally, wherein the split-gate structure comprises a plurality of voltage-controlled FPs, the voltage controller configured to set, based on the control parameter, one or more variable control voltages to control one or more of the plurality of voltage-controlled FPs.

Example 15 includes the subject matter of Example 14, and optionally, wherein the voltage controller is configured to set, based on the control parameter, a plurality of variable control voltages to control the plurality of voltage-controlled FPs, respectively.

Example 16 includes the subject matter of any one of Examples 1-15, and optionally, wherein the voltage controller is configured to set the variable control voltage within a range of voltage levels having a maximal voltage level of 5 Volts.

Example 17 includes the subject matter of any one of Examples 1-16, and optionally, wherein the voltage controller is configured to set the variable control voltage within a range of voltage levels having a minimal voltage level of 0 Volts.

Example 18 includes the subject matter of any one of Examples 1-17, and optionally, comprising a switch mode converter, wherein the MOS transistor is operable as a switching transistor of the switch mode converter.

Example 19 includes the subject matter of Example 18, and optionally, wherein the MOS transistor is operable as a High-Side (HS) switch of the switch mode converter.

Example 20 includes the subject matter of Example 18 or 19, and optionally, wherein the MOS transistor is operable as a Low-Side (LS) switch of the switch mode converter.

Example 21 includes the subject matter of any one of Examples 1-20, and optionally, wherein the MOS transistor comprises a Lateral Double-Diffused MOS (LDMOS).

Example 22 includes an electronic device comprising an electronic circuit; and a switch mode converter to supply voltage to the electronic circuit, the switch mode converter comprising a metal-oxide-semiconductor (MOS) transistor, the MOS transistor comprising a body; a source; a drain; and a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and a voltage controller configured to apply a variable control voltage to the voltage-controlled FP, the variable control voltage based on at least one control parameter, the at least one control parameter comprising at least one of a load current driven by the MOS transistor or a switching frequency of the switching voltage.

Example 23 includes the subject matter of Example 22, and optionally, wherein the voltage controller is configured to set the variable control voltage to a first voltage level based on a first load current driven by the MOS transistor, and to set the variable control voltage to a second voltage level based on a second load current driven by the MOS transistor, the second load current greater than the first load current, the second voltage level is greater than the first voltage level.

Example 24 includes the subject matter of Example 22 or 23, and optionally, wherein the voltage controller is configured to dynamically change the variable control voltage based on a change in the load current.

Example 25 includes the subject matter of any one of Examples 22-24, and optionally, wherein the voltage controller is configured to increase a voltage level of the variable control voltage based on an increase in the load current.

Example 26 includes the subject matter of any one of Examples 22-25, and optionally, wherein the voltage controller is configured to decrease a voltage level of the variable control voltage based on a decrease in the load current.

Example 27 includes the subject matter of any one of Examples 22-26, and optionally, wherein the voltage controller is configured to dynamically change the variable control voltage based on a change in the switching frequency of the switching voltage.

Example 28 includes the subject matter of any one of Examples 22-27, and optionally, wherein the voltage controller is configured to set the variable control voltage to a first voltage level based on a first switching frequency of the switching voltage, and to set the variable control voltage to a second voltage level based on a second switching frequency of the switching voltage, the second switching frequency greater than the first switching frequency, the second voltage level is lower than the first voltage level.

Example 29 includes the subject matter of any one of Examples 22-28, and optionally, wherein the voltage controller is configured to increase a voltage level of the variable control voltage based on a decrease in the switching frequency of the switching voltage.

Example 30 includes the subject matter of any one of Examples 22-29, and optionally, wherein the voltage controller is configured to decrease a voltage level of the variable control voltage based on an increase in the switching frequency of the switching voltage.

Example 31 includes the subject matter of any one of Examples 22-30, and optionally, wherein the voltage controller is configured to dynamically change the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

Example 32 includes the subject matter of any one of Examples 22-31, and optionally, wherein the voltage controller is configured to receive a feedback signal based on the load current, and to provide the variable control voltage to the voltage-controlled FP based on the feedback signal.

Example 33 includes the subject matter of any one of Examples 22-32, and optionally, wherein the voltage controller is configured to receive a frequency indication based on the switching frequency, and to provide the variable control voltage to the voltage-controlled FP based on the frequency indication.

Example 34 includes the subject matter of any one of Examples 22-33, and optionally, wherein the voltage controller is configured to set the variable control voltage when the MOS transistor is at the on state.

Example 35 includes the subject matter of any one of Examples 22-34, and optionally, wherein the split-gate structure comprises a plurality of voltage-controlled FPs, the voltage controller configured to set, based on the control parameter, one or more variable control voltages to control one or more of the plurality of voltage-controlled FPs.

Example 36 includes the subject matter of Example 35, and optionally, wherein the voltage controller is configured to set, based on the control parameter, a plurality of variable control voltages to control the plurality of voltage-controlled FPs, respectively.

Example 37 includes the subject matter of any one of Examples 22-36, and optionally, wherein the voltage controller is configured to set the variable control voltage within a range of voltage levels having a maximal voltage level of 5 Volts.

Example 38 includes the subject matter of any one of Examples 22-37, and optionally, wherein the voltage controller is configured to set the variable control voltage within a range of voltage levels having a minimal voltage level of 0 Volts.

Example 39 includes the subject matter of any one of Examples 22-38, and optionally, wherein the MOS transistor is operable as a switching transistor of the switch mode converter.

Example 40 includes the subject matter of Example 39, and optionally, wherein the MOS transistor is operable as a High-Side (HS) switch of the switch mode converter.

Example 41 includes the subject matter of Example 39 or 40, and optionally, wherein the MOS transistor is operable as a Low-Side (LS) switch of the switch mode converter.

Example 42 includes the subject matter of any one of Examples 22-41, and optionally, wherein the MOS transistor comprises a Lateral Double-Diffused MOS (LDMOS).

Example 43 includes a method of controlling a metal-oxide-semiconductor (MOS) transistor comprising a body, a source, a drain, and a split-gate structure comprising a control gate and at least one voltage-controlled Field-Plate (FP), the control gate is between the source and the voltage-controlled FP, the voltage-controlled FP is between the control gate and the drain, the method comprising switching, by the control gate of the split-gate structure, the MOS transistor between an on state and an off state according to a switching voltage; and applying a variable control voltage to the voltage-controlled FP of the split-gate structure, the variable control voltage based on at least one control parameter, the at least one control parameter including at least one of a load current driven by the MOS transistor or a switching frequency of the switching voltage.

Example 44 includes the subject matter of Example 43, and optionally, comprising setting the variable control voltage to a first voltage level based on a first load current driven by the MOS transistor, and setting the variable control voltage to a second voltage level based on a second load current driven by the MOS transistor, the second load current greater than the first load current, the second voltage level is greater than the first voltage level.

Example 45 includes the subject matter of Example 43 or 44, and optionally, comprising dynamically changing the variable control voltage based on a change in the load current.

Example 46 includes the subject matter of any one of Examples 43-24, and optionally, comprising increasing a voltage level of the variable control voltage based on an increase in the load current.

Example 47 includes the subject matter of any one of Examples 43-46, and optionally, comprising decreasing a voltage level of the variable control voltage based on a decrease in the load current.

Example 48 includes the subject matter of any one of Examples 43-47, and optionally, comprising dynamically changing the variable control voltage based on a change in the switching frequency of the switching voltage.

Example 49 includes the subject matter of any one of Examples 43-48, and optionally, comprising setting the variable control voltage to a first voltage level based on a first switching frequency of the switching voltage, and setting the variable control voltage to a second voltage level based on a second switching frequency of the switching voltage, the second switching frequency greater than the first switching frequency, the second voltage level is lower than the first voltage level.

Example 50 includes the subject matter of any one of Examples 43-49, and optionally, comprising increasing a voltage level of the variable control voltage based on a decrease in the switching frequency of the switching voltage.

Example 51 includes the subject matter of any one of Examples 43-50, and optionally, comprising decreasing a voltage level of the variable control voltage based on an increase in the switching frequency of the switching voltage.

Example 52 includes the subject matter of any one of Examples 43-51, and optionally, comprising dynamically changing the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

Example 53 includes the subject matter of any one of Examples 43-52, and optionally, comprising receiving a feedback signal based on the load current, and providing the variable control voltage to the voltage-controlled FP based on the feedback signal.

Example 54 includes the subject matter of any one of Examples 43-53, and optionally, comprising receiving a frequency indication based on the switching frequency, and providing the variable control voltage to the voltage-controlled FP based on the frequency indication.

Example 55 includes the subject matter of any one of Examples 43-54, and optionally, comprising setting the variable control voltage when the MOS transistor is at the on state.

Example 56 includes the subject matter of any one of Examples 43-55, and optionally, wherein the split-gate structure comprises a plurality of voltage-controlled FPs, the method comprising setting, based on the control parameter, one or more variable control voltages to control one or more of the plurality of voltage-controlled FPs.

Example 57 includes the subject matter of Example 56, and optionally, comprising setting, based on the control parameter, a plurality of variable control voltages to control the plurality of voltage-controlled FPs, respectively.

Example 58 includes the subject matter of any one of Examples 43-57, and optionally, comprising setting the variable control voltage within a range of voltage levels having a maximal voltage level of 5 Volts.

Example 59 includes the subject matter of any one of Examples 43-58, and optionally, comprising setting the variable control voltage within a range of voltage levels having a minimal voltage level of 0 Volts.

Example 60 includes the subject matter of any one of Examples 43-59, and optionally, wherein the MOS transistor is operable as a switching transistor of a switch mode converter.

Example 61 includes the subject matter of Example 60, and optionally, wherein the MOS transistor is operable as a High-Side (HS) switch of the switch mode converter.

Example 62 includes the subject matter of Example 60 or 61, and optionally, wherein the MOS transistor is operable as a Low-Side (LS) switch of the switch mode converter.

Example 63 includes the subject matter of any one of Examples 43-62, and optionally, wherein the MOS transistor comprises a Lateral Double-Diffused MOS (LDMOS).

Example 64 includes a product comprising one or more tangible computer-readable non-transitory storage media comprising computer-executable instructions operable to, when executed by at least one processor, enable the at least one processor to control a metal-oxide-semiconductor (MOS) transistor in an Integrated Chip (IC), the MOS transistor comprising a body, a source, a drain, and a split-gate structure comprising a control gate and at least one voltage-controlled Field-Plate (FP), the control gate is between the source and the voltage-controlled FP, and the voltage-controlled FP is between the control gate and the drain, wherein the instructions, when executed, cause the IC to switch, by the control gate of the split-gate structure, the MOS transistor between an on state and an off state according to a switching voltage; and apply a variable control voltage to the voltage-controlled FP of the split-gate structure, the variable control voltage based on at least one control parameter, the at least one control parameter including at least one of a load current driven by the MOS transistor or a switching frequency of the switching voltage.

Example 65 includes the subject matter of Example 64, and optionally, wherein the instructions, when executed, cause the IC to set the variable control voltage to a first voltage level based on a first load current driven by the MOS transistor, and to set the variable control voltage to a second voltage level based on a second load current driven by the MOS transistor, the second load current greater than the first load current, the second voltage level is greater than the first voltage level.

Example 66 includes the subject matter of Example 64 or 65, and optionally, wherein the instructions, when executed, cause the IC to dynamically change the variable control voltage based on a change in the load current.

Example 67 includes the subject matter of any one of Examples 64-66, and optionally, wherein the instructions, when executed, cause the IC to increase a voltage level of the variable control voltage based on an increase in the load current.

Example 68 includes the subject matter of any one of Examples 64-67, and optionally, wherein the instructions, when executed, cause the IC to decrease a voltage level of the variable control voltage based on a decrease in the load current.

Example 69 includes the subject matter of any one of Examples 64-68, and optionally, wherein the instructions, when executed, cause the IC to dynamically change the variable control voltage based on a change in the switching frequency of the switching voltage.

Example 70 includes the subject matter of any one of Examples 64-59, and optionally, wherein the instructions, when executed, cause the IC to set the variable control voltage to a first voltage level based on a first switching frequency of the switching voltage, and to set the variable control voltage to a second voltage level based on a second switching frequency of the switching voltage, the second switching frequency greater than the first switching frequency, the second voltage level is lower than the first voltage level.

Example 71 includes the subject matter of any one of Examples 64-70, and optionally, wherein the instructions, when executed, cause the IC to increase a voltage level of the variable control voltage based on a decrease in the switching frequency of the switching voltage.

Example 72 includes the subject matter of any one of Examples 64-71, and optionally, wherein the instructions, when executed, cause the IC to decrease a voltage level of the variable control voltage based on an increase in the switching frequency of the switching voltage.

Example 73 includes the subject matter of any one of Examples 64-72, and optionally, wherein the instructions, when executed, cause the IC to dynamically change the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

Example 74 includes the subject matter of any one of Examples 64-73, and optionally, wherein the instructions, when executed, cause the IC to receive a feedback signal based on the load current, and to provide the variable control voltage to the voltage-controlled FP based on the feedback signal.

Example 75 includes the subject matter of any one of Examples 64-74, and optionally, wherein the instructions, when executed, cause the IC to receive a frequency indication based on the switching frequency, and to provide the variable control voltage to the voltage-controlled FP based on the frequency indication.

Example 76 includes the subject matter of any one of Examples 64-75, and optionally, wherein the instructions, when executed, cause the IC to set the variable control voltage when the MOS transistor is at the on state.

Example 77 includes the subject matter of any one of Examples 64-76, and optionally, wherein the split-gate structure comprises a plurality of voltage-controlled FPs, wherein the instructions, when executed, cause the IC to set, based on the control parameter, one or more variable control voltages to control one or more of the plurality of voltage-controlled FPs.

Example 78 includes the subject matter of Example 77, and optionally, wherein the instructions, when executed, cause the IC to set, based on the control parameter, a plurality of variable control voltages to control the plurality of voltage-controlled FPs, respectively.

Example 79 includes the subject matter of any one of Examples 64-78, and optionally, wherein the instructions, when executed, cause the IC to set the variable control voltage within a range of voltage levels having a maximal voltage level of 5 Volts.

Example 80 includes the subject matter of any one of Examples 64-79, and optionally, wherein the instructions, when executed, cause the IC to set the variable control voltage within a range of voltage levels having a minimal voltage level of 0 Volts.

Example 81 includes the subject matter of any one of Examples 64-79, and optionally, wherein the MOS transistor is operable as a switching transistor of a switch mode converter.

Example 82 includes the subject matter of Example 81, and optionally, wherein the MOS transistor is operable as a High-Side (HS) switch of the switch mode converter.

Example 83 includes the subject matter of Example 81 or 82, and optionally, wherein the MOS transistor is operable as a Low-Side (LS) switch of the switch mode converter.

Example 84 includes the subject matter of any one of Examples 64-83, and optionally, wherein the MOS transistor comprises a Lateral Double-Diffused MOS (LDMOS).

Example 85 includes an Integrated Circuit (IC) comprising a metal-oxide-semiconductor (MOS) transistor, the MOS transistor comprising a body; a source; a drain; and a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and means for applying a variable control voltage to the voltage-controlled FP, the variable control voltage based on at least one control parameter, the at least one control parameter comprising at least one of a load current driven by the MOS transistor or a switching frequency of the switching voltage.

Example 86 includes the subject matter of Example 85, and optionally, comprising means for setting the variable control voltage to a first voltage level based on a first load current driven by the MOS transistor, and setting the variable control voltage to a second voltage level based on a second load current driven by the MOS transistor, the second load current greater than the first load current, the second voltage level is greater than the first voltage level.

Example 87 includes the subject matter of Example 85 or 86, and optionally, comprising means for dynamically changing the variable control voltage based on a change in the load current.

Example 88 includes the subject matter of any one of Examples 85-87, and optionally, comprising means for increasing a voltage level of the variable control voltage based on an increase in the load current.

Example 89 includes the subject matter of any one of Examples 85-88, and optionally, comprising means for decreasing a voltage level of the variable control voltage based on a decrease in the load current.

Example 90 includes the subject matter of any one of Examples 85-89, and optionally, comprising means for dynamically changing the variable control voltage based on a change in the switching frequency of the switching voltage.

Example 91 includes the subject matter of any one of Examples 85-90, and optionally, comprising means for setting the variable control voltage to a first voltage level based on a first switching frequency of the switching voltage, and setting the variable control voltage to a second voltage level based on a second switching frequency of the switching voltage, the second switching frequency greater than the first switching frequency, the second voltage level is lower than the first voltage level.

Example 92 includes the subject matter of any one of Examples 85-91, and optionally, comprising means for increasing a voltage level of the variable control voltage based on a decrease in the switching frequency of the switching voltage.

Example 93 includes the subject matter of any one of Examples 85-92, and optionally, comprising means for decreasing a voltage level of the variable control voltage based on an increase in the switching frequency of the switching voltage.

Example 94 includes the subject matter of any one of Examples 85-93, and optionally, comprising means for dynamically changing the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

Example 95 includes the subject matter of any one of Examples 85-94, and optionally, comprising means for receiving a feedback signal based on the load current, and providing the variable control voltage to the voltage-controlled FP based on the feedback signal.

Example 96 includes the subject matter of any one of Examples 85-95, and optionally, comprising means for receiving a frequency indication based on the switching frequency, and providing the variable control voltage to the voltage-controlled FP based on the frequency indication.

Example 97 includes the subject matter of any one of Examples 85-96, and optionally, comprising means for setting the variable control voltage when the MOS transistor is at the on state.

Example 98 includes the subject matter of any one of Examples 85-97, and optionally, wherein the split-gate structure comprises a plurality of voltage-controlled FPs, the IC comprising means for setting, based on the control parameter, one or more variable control voltages to control one or more of the plurality of voltage-controlled FPs.

Example 99 includes the subject matter of Example 98, and optionally, comprising means for setting, based on the control parameter, a plurality of variable control voltages to control the plurality of voltage-controlled FPs, respectively.

Example 100 includes the subject matter of any one of Examples 85-99, and optionally, comprising means for setting the variable control voltage within a range of voltage levels having a maximal voltage level of 5 Volts.

Example 101 includes the subject matter of any one of Examples 85-100, and optionally, comprising means for setting the variable control voltage within a range of voltage levels having a minimal voltage level of 0 Volts.

Example 102 includes the subject matter of any one of Examples 85-101, and optionally, wherein the MOS transistor is operable as a switching transistor of a switch mode converter.

Example 103 includes the subject matter of Example 102, and optionally, wherein the MOS transistor is operable as a High-Side (HS) switch of the switch mode converter.

Example 104 includes the subject matter of Example 102 or 103, and optionally, wherein the MOS transistor is operable as a Low-Side (LS) switch of the switch mode converter.

Example 105 includes the subject matter of any one of Examples 85-104, and optionally, wherein the MOS transistor comprises a Lateral Double-Diffused MOS (LDMOS).

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:
1. An Integrated Circuit (IC) comprising:
   a metal-oxide-semiconductor (MOS) transistor, the MOS transistor comprising:
      a body;
      a source;
      a drain; and
      a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and
   a voltage controller configured to apply a variable control voltage to the voltage-controlled FP, the variable control voltage based on at least one control parameter, the at least one control parameter comprising at least one of a load current driven by the MOS transistor or a switching frequency of the switching voltage.

2. The IC of claim 1, wherein the voltage controller is configured to set the variable control voltage to a first voltage level based on a first load current driven by the MOS transistor, and to set the variable control voltage to a second voltage level based on a second load current driven by the MOS transistor, the second load current greater than the first load current, the second voltage level is greater than the first voltage level.

3. The IC of claim 1, wherein the voltage controller is configured to dynamically change the variable control voltage based on a change in the load current.

4. The IC of claim 1, wherein the voltage controller is configured to increase a voltage level of the variable control voltage based on an increase in the load current.

5. The IC of claim 1, wherein the voltage controller is configured to decrease a voltage level of the variable control voltage based on a decrease in the load current.

6. The IC of claim 1, wherein the voltage controller is configured to dynamically change the variable control voltage based on a change in the switching frequency of the switching voltage.

7. The IC of claim 1, wherein the voltage controller is configured to set the variable control voltage to a first voltage level based on a first switching frequency of the switching voltage, and to set the variable control voltage to a second voltage level based on a second switching frequency of the switching voltage, the second switching frequency greater than the first switching frequency, the second voltage level is lower than the first voltage level.

8. The IC of claim 1, wherein the voltage controller is configured to increase a voltage level of the variable control voltage based on a decrease in the switching frequency of the switching voltage.

9. The IC of claim 1, wherein the voltage controller is configured to decrease a voltage level of the variable control voltage based on an increase in the switching frequency of the switching voltage.

10. The IC of claim 1, wherein the voltage controller is configured to dynamically change the variable control voltage based on a predefined control function, which is based on the control parameter, the predefined control function to define a minimal voltage level corresponding to a first predefined level of the control parameter, a maximal voltage level corresponding to a second predefined level of the control parameter, and a monotonic change of the control voltage between the minimal voltage level and the maximal voltage level corresponding to a change of the control parameter from the first predefined level of the control parameter to the second predefined level of the control parameter.

11. The IC of claim 1, wherein the voltage controller is configured to receive a feedback signal based on the load current, and to provide the variable control voltage to the voltage-controlled FP based on the feedback signal.

12. The IC of claim 1, wherein the voltage controller is configured to receive a frequency indication based on the switching frequency, and to provide the variable control voltage to the voltage-controlled FP based on the frequency indication.

13. The IC of claim 1, wherein the voltage controller is configured to set the variable control voltage when the MOS transistor is at the on state.

14. The IC of claim 1, wherein the split-gate structure comprises a plurality of voltage-controlled FPs, the voltage controller configured to set, based on the control parameter, one or more variable control voltages to control one or more of the plurality of voltage-controlled FPs.

15. The IC of claim 14, wherein the voltage controller is configured to set, based on the control parameter, a plurality of variable control voltages to control the plurality of voltage-controlled FPs, respectively.

16. The IC of claim 1, wherein the voltage controller is configured to set the variable control voltage within a range of voltage levels having a maximal voltage level of 5 Volts.

17. The IC of claim 1 comprising a switch mode converter, wherein the MOS transistor is operable as a switching transistor of the switch mode converter.

18. The IC of claim 1, wherein the MOS transistor comprises a Lateral Double-Diffused MOS (LDMOS).

19. An electronic device comprising:
an electronic circuit; and
a switch mode converter to supply voltage to the electronic circuit, the switch mode converter comprising:
a metal-oxide-semiconductor (MOS) transistor, the MOS transistor comprising:
a body;
a source;
a drain; and
a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and
a voltage controller configured to apply a variable control voltage to the voltage-controlled FP, the variable control voltage based on at least one control parameter, the at least one control parameter comprising at least one of a load current driven by the MOS transistor or a switching frequency of the switching voltage.

20. The electronic device of claim 19, wherein the voltage controller is configured to dynamically change the variable control voltage based on a change in the load current.

21. The electronic device of claim 19, wherein the voltage controller is configured to dynamically change the variable control voltage based on a change in the switching frequency of the switching voltage.

22. An Integrated Circuit (IC) comprising:
a metal-oxide-semiconductor (MOS) transistor, the MOS transistor comprising:
a body;
a source;
a drain; and
a split-gate structure comprising a control gate and at least one voltage-controlled Field-Plate (FP), the control gate is between the source and the voltage-controlled FP, the voltage-controlled FP is between the control gate and the drain, the control gate configured to switch the MOS transistor between an on state and an off state according to a switching voltage; and
means for applying a variable control voltage to the voltage-controlled FP, the variable control voltage based on at least one control parameter, the at least one control parameter comprising at least one of a load current driven by the MOS transistor or a switching frequency of the switching voltage.

23. The IC of claim 22 comprising means for dynamically changing the variable control voltage based on a change in the load current.

* * * * *